United States Patent
Tsujimura et al.

(10) Patent No.: US 6,600,196 B2
(45) Date of Patent: Jul. 29, 2003

(54) THIN FILM TRANSISTOR, AND MANUFACTURING METHOD THEREOF

(75) Inventors: Takatoshi Tsujimura, Fujisawa (JP); Osamu Tokuhiro, Shiga-ken (JP); Mitsuo Morooka, Kawasaki (JP); Takashi Miyamoto, Chofu (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/761,030

(22) Filed: Jan. 16, 2001

(65) Prior Publication Data

US 2001/0022361 A1 Sep. 20, 2001

(30) Foreign Application Priority Data

Jan. 13, 2000 (JP) ........................................ 2000-004301

(51) Int. Cl.[7] ............................................... H01L 27/01
(52) U.S. Cl. ........................... 257/349; 257/58; 257/62; 257/354
(58) Field of Search ............................... 257/57, 58, 59, 257/62, 347, 349, 354

(56) References Cited

U.S. PATENT DOCUMENTS

| | | | | |
|---|---|---|---|---|
| 3,890,632 A | * | 6/1975 | Ham et al. | 257/354 |
| 4,015,279 A | * | 3/1977 | Ham | 257/354 |
| 4,054,894 A | * | 10/1977 | Heagerty et al. | 257/354 |
| 4,252,574 A | * | 2/1981 | Fabula | 438/164 |
| 4,272,880 A | * | 6/1981 | Pashley | 438/153 |
| 5,041,913 A | * | 8/1991 | Abe | 348/248 |
| 5,075,244 A | * | 12/1991 | Sakai et al. | 438/59 |
| 5,498,894 A | * | 3/1996 | Kokubun | 257/349 |
| 5,652,453 A | * | 7/1997 | Iwamatsu et al. | 257/347 |
| 5,698,885 A | * | 12/1997 | Warashina et al. | 257/349 |
| 6,060,751 A | * | 5/2000 | Terauchi et al. | 257/354 |

FOREIGN PATENT DOCUMENTS

| | | | |
|---|---|---|---|
| JP | 3-52-16183 | * 2/1977 | .................. 257/354 |
| JP | 1-149480 | 6/1989 | |
| JP | 4-367276 | 12/1992 | |
| JP | 07-030117 | 3/1995 | |
| JP | 08-046203 | 2/1996 | |
| JP | 08-107212 | 4/1996 | |
| JP | 2522364 | 5/1996 | |
| JP | 10-041519 | 2/1998 | |
| JP | 10-070276 | 3/1998 | |
| JP | 10-082997 | 3/1998 | |
| JP | 11-052423 | 2/1999 | |

OTHER PUBLICATIONS

Machine translation of JP 08–107212 (reference from IDS paper No. 10).*

* cited by examiner

*Primary Examiner*—George Eckert
(74) *Attorney, Agent, or Firm*—Scully, Scott, Murphy & Presser; Derek S. Jennings, Esq.

(57) ABSTRACT

The present invention relates to minimizing a leakage current in a floating island portion formed in a thin film transistor. More specifically, the present invention is directed to a thin film transistor including: a source electrode 14 and a drain electrode 15 disposed above an insulating substrate 11 at a predetermined interval; an s-Si film 16 disposed in relation to the source electrode 14 and drain electrode 15; a gate insulating film 17 overlapping the a-Si film 16; and a gate electrode 18 overlapping the gate insulating film 17, in which the a-Si film 16 is disposed between the source electrode 14 and the drain electrode 15 and has a floating island portion 20 above which or beneath which the gate electrode 18 is not formed, and boron ions are implanted into this portion to form a boron-ion-implanted region 19.

2 Claims, 8 Drawing Sheets

THIN FILM TRANSISTOR, AND MANUFACTURING METHOD THEREOF

BACKGROUND OF THE INVENTION

1. Technical Field

The present invention relates to a thin film transistor that is used in liquid crystal displays of the active matrix system, and a method for manufacturing such a thin film transistor.

2. Prior Art

In a liquid crystal display of the active matrix system that uses thin film transistors, liquid crystals are sealed between a TFT array substrate and a counter substrate overlapping the TFT array substrate with a certain distance. On the TFT array substrate, gate electrodes (Y electrodes) and data electrodes (X electrodes) are arranged as a matrix, and thin film transistors (TFTs) are disposed on the intersections of the gate electrodes and the-data electrodes. The thin film transistors control the voltage impressed to the liquid crystals, and the electrooptic effect of the liquid crystals is utilized to enable displaying.

FIGS. 7A and 7B are diagrams illustrating the structure of a top-gate type thin film transistor. Conventionally known structures of thin film transistors are a top-gate (positive-stagger) type structure and a bottom-gate (inverse-stagger) type structure. The structure of a top-gate type thin film transistor will be described referring to FIG. 7A. The top-gate type thin film transistor comprises a light-shield film 102 provided on an insulating substrate 101 such as a glass substrate, on which an insulating film 103 comprising silicon oxide, $SiO_x$, or silicon nitride, $SiN_x$, is formed. Above the insulating film 103, a drain electrode 104 and a source electrode 105 composed of ITO (indium tin oxide) films are disposed of a predetermined channel distance. An amorphous silicon film (a-Si film) 106, as a semiconductor film, that covers both electrodes is provided; a gate insulating film 107 comprising $SiO_x$ or $SiN_x$, is provided above the a-Si film 106; and a gate electrode 108 is provided above the gate insulator film 107, to form an island-shaped region called an a-Si island.

As a process for the manufacture of such a thin film transistor, a process known as 7-PEP (PEP: photo engraving process) structure is generally present. In this 7-PEP structure, after a drain electrode 104 and a source electrode 105 composed of ITO film have been patterned, an a-Si film 106 is formed by CVD (chemical vapour deposition), and is patterned in an island shape. A gate insulating film 107 is then formed by CVD, and is patterned to a desired shape. After that, a gate electrode 108, for example of aluminum (Al), is formed by sputtering, and is patterned to complete a TFT.

However, since such a 7-PEP structure required a large number of process steps, a next-generation 4-PEP structure that requires less process steps had been proposed. In the 4-PEP structure, the gate insulating film 107 and the a-Si film 106 underlying the gate electrode 108 are simultaneously etched. That is, the gate electrode 108, the gate insulating film 107, and the a-Si film 106 are sequentially etched in one patterning step using the plated pattern of the gate electrode 108 as a mask. The 4-PEP structure excels in that the manufacturing process is shortened. FIG. 7A shows the top-gate type thin film transistor produced by the shortened manufacturing process.

Here, if the gate electrode 108, the gate insulating film 1.07, and the a-Si film 106 are sequentially eteched in one patterning step, the distance between the end of the gate electrode 108 and the source and drain electrodes 105 and 104 is much shortened as shown in FIG. 7A. That is, this distance is at largest 0.4 $\mu$m, easily causing short-circuiting between the end surface of the gate electrode 108 and the source and drain electrodes 105 and 104 due to surface leakage.

To cope with this problem, the gate electrode 108 is over-etched as shown in FIG. 7B. That is, by over-etching the gate electrode 108 during patterning, a length of about 1.5 $\mu$m is secured as shown in FIG. 7B, and by clearing a distance of 1.9 $\mu$m (about 2 $\mu$m) between the source electrode 105 and the drain electrode 104, short-circuiting due to surface leakage is prevented.

The present applicant had presented Japanese Patent Application No. 11-214603 as a technique related to this shortened manufacturing process. The present application provides techniques for decreasing the number of process steps required in the manufacturing process of thin film transistors, as well as for preventing the generation of an abnormal potential due to leakage current from other data lines.

Although, it is not related to decrease in the number of process steps at all, the background art, related to the present invention includes Japanese Patent No. 2522364, and Published Unexamined Patent Application Nos. 1-149480 and 4-367276.

As described above, the over-etching of the gate line at the time of forming the gate electrode 108 of a top-gate type TFT, and the island cutting using a resist mask (not shown) for forming the gate electrode 108 (etching of the gate insulating film 107 and the a-Si film 106) enable the simplificaiton of the process and the prevention of short-circuiting due to surface leakage.

However, it has now been found that the above-described method might result in the occurrence of leakage in the island portion not covered with the gate electrode 108 (floating island).

FIGS. 8A and 8B are diagrams that illustrate the states where the floating island portion has been formed. The circumference region of the gate electrode 108 shown in FIGS. 8A and 8b is the floating island portion 109. Although electrodes are normally disposed above and beneath an a-Si film, the gate electrode 108 is not formed above or beneath the a-Si film 106 that constitutes this floating island portion 109, which unique as the usage of a-Si. Therefore, voltage is not controlled in this floating island portion 109. That is, the floating island portion 109 is not covered with the gate electrode 108, and is in the state where portions nearer the end are more difficult to be controlled by the gate voltage of the gate electrode 108. The detection of leakage paths using OBIC (optically beam induced current) analysis revealed that leakage occurred due to the voltage between the source electrode 105 and the drain electrode 104 at the portion in the floating island 109 between the source electrode 105 and the drain electrode 104, above which or beneath which the gate electrode 108 is not formed, that is, the hatched area shown in FIGS. 8A and 8B. When leakage occurs at the leakage portion 110, i.e. the hatched area, voltage cannot be controlled between the source electrode 105 and the drain electrode 104, and the problem such as the discoloration of pixels due to an abnormal voltage has arisen.

Therefore, the present invention is achieved to solve the above technical problems and the object of the present invention is to reduce leakage current in a floating island portion formed in a thin film transistor.

SUMMARY OF THE INVENTION

A thin film transistor to which the present invention is applied comprises a source electrode and a drain electrode disposed above an insulating substrate at a predetermined interval; a semiconductor film disposed in relation to the source and drain electrodes; a gate insulating film overlapping the semiconductor film; and a gate electrode overlapping the gate insulator film. The semiconductor film has a portion which is disposed between the source electrode and the drain electrode, and above which or beneath which the gate electrode is not formed. A P-type impurity is implanted into the portion.

This P-type impurity is characterized in being boron ion. Boron ion is one of lightest ions as P-type impurities, and is preferable in that it can be implanted into a semiconductor film with a high power. Especially when boron ion is implanted into the semiconductor film from the top of a gate insulating film the light boron ion is preferable because it must be implanted into the semiconductor film through this gate insulating film.

Also, this semiconductor film is characterized in that it is provided with a floating island portion formed around said gate electrode and patterned larger than the gate electrode by a predetermined dimension. This is preferable in that, for example, short-circuiting due to surface leakage between the patterned end surface of the gate electrode and the source and the drain electrodes can be prevented, when a semiconductor film is formed in the same pattern as the gate electrode pattern by a shortened manufacturing step and the leakage current between the source and drain electrodes generated through this floating island portion can be prevented.

Also, a thin film transistor to which the present invention is applied comprises a source electrode and a drain electrode disposed above an insulating substrate at a predetermined interval; a semiconductor film in relation to the source and drain electrodes; a gate insulating film overlapping the semiconductor film; and a gate electrode overlapping the gate insulator film. The semiconductor film has a portion which is disposed between the source electrode and the drain electrode, and above which or beneath which the gate electrode is not formed, a polymer structural film is formed on a patterned end surface of this semiconductor film.

In other words, the polymer structural film formed on a patterned end surface of this semiconductor film is characterized in being a leakage preventing film in which a polymer structure is bonded to the cut sections of silicon.

From a different viewpoint, a thin film transistor to which the present invention is applied comprises a source electrode and a drain electrode disposed above an insulating substrate at a predetermined interval; a semiconductor film disposed in relation to the source and drain electrodes; a gate insulating film overlapping the semiconductor film; and a gate electrode overlapping the gate insulator film. The semiconductor film is provided with a measure preventing the leakage current between the source electrode and the drain electrode on a portion above which or beneath which the gate electrode is not formed, or the patterned end surface of the semiconductor film.

If the leakage current preventing measure provided to this semiconductor film is characterized in being a measure for elevating the threshold voltage (Vth) in relation to the portion above which or beneath which the gate electrode is not formed, it is preferable in that leakage paths are substantially eliminated in relation to the floating portion above which or beneath which the gate electrode is not formed.

Also, if the leakage current preventing measure provided to this semiconductor film is characterized by a measure for removing the positive charge of the patterned end surface, it is preferable in that the induction of the conductive electron that causes leakage can be prevented.

In these inventions, it is sufficient if the source electrode and the drain electrode are formed "above" the insulating substrate, and these inventions can be applied to either a top-gate type TFT provided with these electrodes on the insulating substrate side, above which a gate electrode is provided; or a bottom-gate type TFT provided with a gate electrode on the insulating substrate side, above which source and drain electrodes are formed. The expression of "overlapping" contains not only overlying, but also underlying, and it is not necessary to contact with each other, but the laminated construction with other materials intervening in between may be used.

On the other hand, when the present invention is viewed from the manufacturing method, a method for manufacturing a thin film transistor in the present invention comprises a step of forming a gate electrode, a semiconductor film, a source electrode, and a drain electrode on a substrate; and a step of implanting a P-type impurity into the semiconductor film formed in the above step at least in a portion between the source and drain electrodes above which or beneath which the gate electrode is not formed.

Also, a method for manufacturing a thin film transistor in the present invention comprises a first step of forming a gate electrode, a semiconductor film, a source electrode, and a drain electrode on a substrate; and a second step of forming a polymer structural film on the end surface of the semiconductor film formed in the above step.

This first step is characterized by comprising forming floating island portion of said semiconductor film above which or beneath which said gate electrode is not formed.

Furthermore, a method for manufacturing a thin film transistor in the present invention comprises a light-shield film deposition step of depositing a light-shield film of a predetermined shape on an insulating substrate; and insulating film formation step of forming an insulating film that covers the light-shield film on the insulating substrate; a source and drain electrodes formation step of forming a source electrode and a drain electrode consisting of metal films that have a predetermined line width and length, and disposed above the insulating substrate at a predetermined interval; a semiconductor and insulating films formation step of sequentially forming a semiconductor film and a gate insulating film above the source electrode and the drain electrode; a gate electrode deposition step of depositing a metal film for the gate electrode above the gate insulating film; a gate electrode patterning step of providing a resist mask for masking the gate electrode above the metal film for the gate electrode, and for patterning the gate electrode using the resist mask; a step of patterning the semiconductor film and the gate insulating film using the resist mask; a step of peeling off the resist mask; and a boron ion implanting step of implanting boron ions into the gate insulator film and the semiconductor film. According to this manufacturing method, since the semiconductor film and the like can be patterned using the resist mask used in the patterning of the gate electrode, the number of process steps required in the TFT manufacturing process can be reduced, and the leakage current between the source and drain electrodes can be minimized.

If this gate electrode-patterning step is characterized in a step of patterning the gate electrode by over-etching the metal film for the gate electrode in relation to the resist mask, the number of process steps can be reduced, and also short-circuiting due to surface leakage between the gate electrode and the source and drain electrodes can be prevented.

Also, if the boron ion implanting step is characterized by a step of implanting at least $1\times10^{18}$ atoms/cm$^3$ of the boron ions into the semiconductor film, leakage current can be decreased to a drivable range.

The method for manufacturing a thin film transistor according to the present invention can be characterized by comprising a terminating treatment step of the terminating treatment for cut sections of silicon for the patterned end surface of the semiconductor film in place of, or in addition to, the above-described boron ion implanting step. By such a constitution, a TFT that excels in holding characteristics can be formed without increasing the auxiliary capacity.

This terminating treatment can be characterized in an HMDS treatment to the formed thin film transistor substrate. Such a treatment can terminate the cut sections of silicon by converting to silanol, and enables the manufacture of a TFT that has a high leakage reducing effect in a simple process.

BRIEF DESCRIPTION OF THE DRAWINGS

Preferred embodiments of the present invention will now be described, by way of example only, with reference to the accompanying drawings in which.

DETAILED DESCRIPTION OF THE PREFERRED EMBODIMENTS OF THE INVENTION

The present invention will be described in detail below referring to the embodiments of the present invention shown in attached drawings.

Figure 1A:
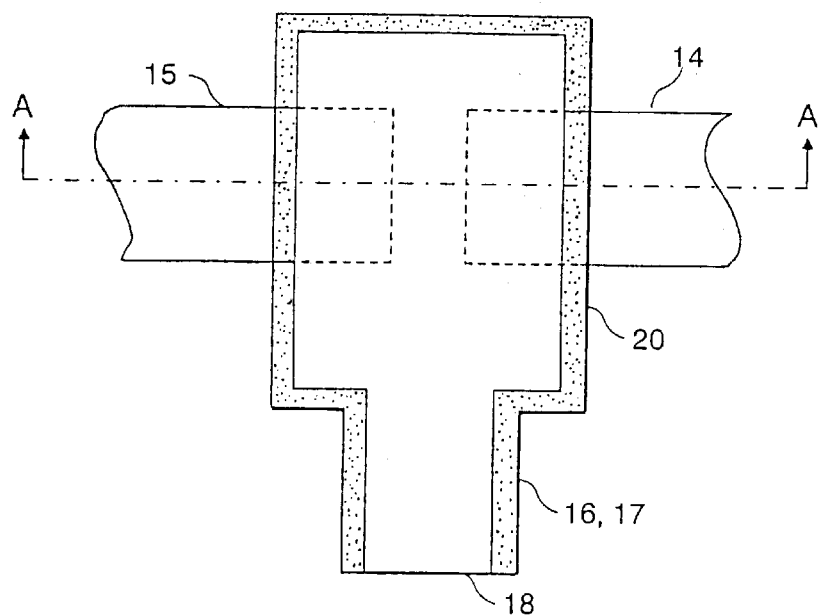
FIGS. 1A and 1B are diagrams showing the structure of a thin film transistor (TFT) according to an embodiment of the present invention.
Figure 1B:
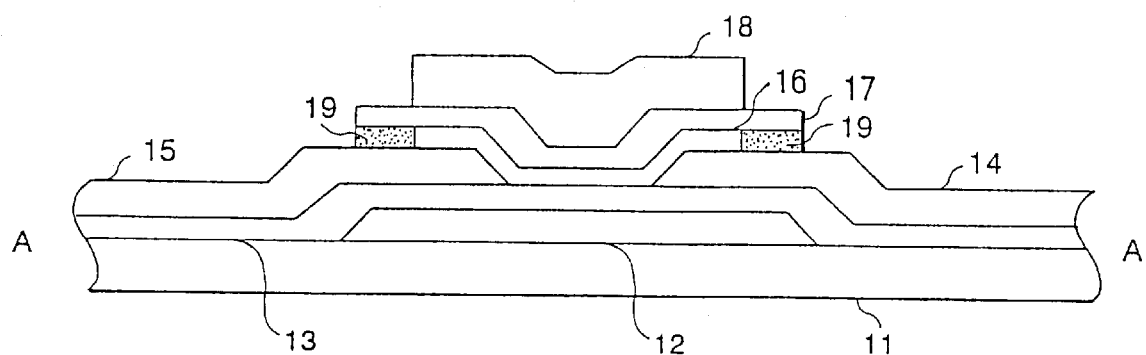

FIGS. 1A and 1B are diagrams showing the structure of a thin film transistor (TFT) of Embodiment 1 exemplified by a top-gate type TFT. FIG. 1A is a plan of this TFT formed by a shortened manufacturing process described later. FIG. 1B shows a sectional view taken along the line A—A of FIG. 1A. As FIG. 1B shows, the TFT of this embodiment comprises a light-shield film 12 comprises Mo and an Mo alloy such as Mo—Cr disposed on an insulating substrate 11 made of alkali-free glass or quartz, and an insulting adulating film 13 as an undercoat film comprising silicon oxide $SiO_x$ or silicon nitride $SiN_x$ that covers the light-shield film 12. A pixel electrode (not shown) comprising indium tin oxide (ITO) as a transparent conductive film is formed above the insulating film 13, and patterned are a source electrode 14 and a drain electrode 15 formed integrally with this pixel electrode by laminating a metal film of Mo or an Mo alloy with Ti, Ta, Cr, Nb, W, or Ag, e.g. a molybdenum-tungsten alloy (Mo—W) on the upper layer of the ITO film.

Above the patterned source electrode 14 and drain electrode 15 is deposited an a-Si film 16 that forms the semiconductor film, above which a gate insulating film 17 composed of a fist silicon nitride film (first $SiN_x$ film) and a second silicon nitride film (second $SiN_x$ film)as the passivation film of the TFT channel is deposited. Furthermore, a gate electrode 18 composed of a metal such as Cr and Al is formed above the gate insulating film 17. In this embodiment, after over-etching a gate electrode 18 using a resist mask (described later), an a-Si film 16 and a gate insulating film 17 are simultaneously formed by dry-etching using this resist mask in order to shorten a manufacturing process.

In this embodiment, as FIG. 1A shows, the circumference of the gate electrode 18 is over-etched in a width of about 1.5 $\mu$m to prevent short-circuiting due to surface leakage, resulting in the formation of a floating island portion 20 comprising the a-Si film 16 and the gate insulating film 17 around the gate electrode 18. If a TFT that has this floating island portion 20 is used without any measures, a leakage current is produced due to the presence of a region between the source electrode 14 and the drain electrode 15 in the floating island portion 20. Therefore, in this embodiment, a boron ion implanted region 19 as shown in FIG. 1B is provided in the a-Si film 16 corresponding to the floating island portion 20. By providing this boron ion implanted region 19, the leakage current can be minimized to a drivable range.

Figure 2:
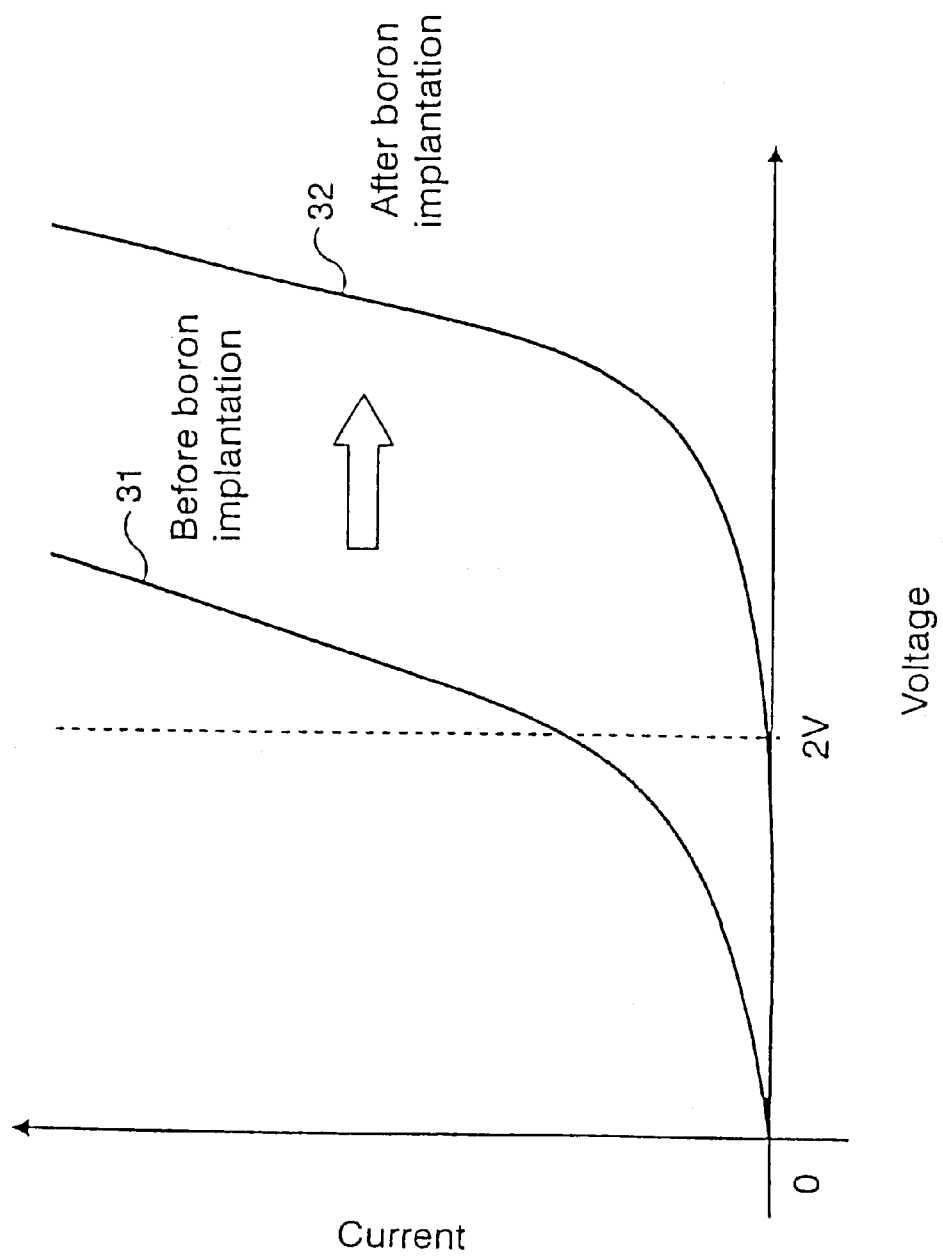
FIG. 2 is a graph illustrating the property of a TFT before and after implanting boron, a P-type impurity, into a-Si.

FIG. 2 is a graph for illustrating the characteristics when boron, a P-type impurity, is implanted into a-Si. In FIG. 2, the curve 31 shows the characteristics before implanting boron, and the curve 32 shows the characteristics after implanting boron. Since the characteristics after boron implanting (curve 32) differ depending on the quantity of implanted boron, the characteristics are conceptually shown for the ease of technical understanding. Before boron implanting (curve 31), current increases as voltage is elevated. For example, a certain current flows when voltage is 2 volts. After boron implanting (curve 32), the flow of current can be inhibited, for example, at a voltage of 2 volts. In this embodiment, for example, boron, a P-type impurity, is implanted into the floating island portion 20 of the a-Si film 16, but not implanted into the region above which the gate electrode 18 is present even though this region is the a-Si film 16. Such a constitution enables current to be inhibited at a certain voltage in the floating island portion 20, which is the region in which voltage cannot be controlled by the gate electrode 18, while maintaining required TFT characteristics in the portion where the gate electrode 18 is present. As a result, leakage current due to the source electrode 14 and the drain electrode 15 can be reduced.

Figure 3:
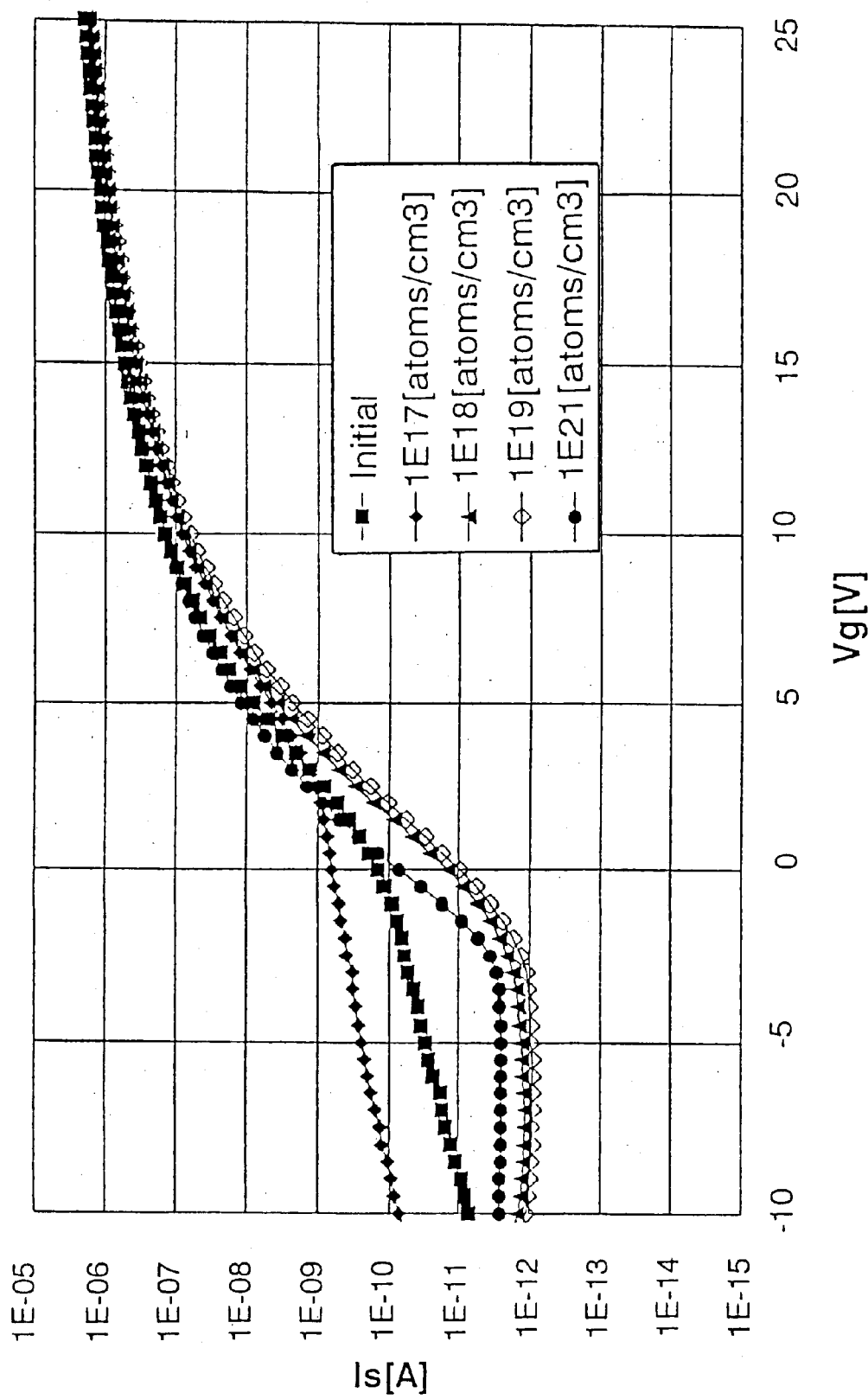
FIG. 3 is a graph showing the leakage reducing effect by implanting boron ions.

FIG. 3 is a graph showing the leakage reducing effect by implanting boron ions. The abscissa of the graph of FIG. 3 indicates gate voltage (Vg), and the ordinate indicates current (Ids) flowing through the boron ion implanted region 19 of the a-Si film 16. For example, 1E-10 means $1\times10^{-10}$. The "Initial" curve shows the state where boron has not been implanted. In the case of 1E17 [atoms/cm$^3$], that is, when 1E17 ($1\times10^{17}$) atoms of boron ions per cubic centimeter are implanted, the effect of boron cannot be obtained because of physical damage. If 1E18 [atoms/cm$^3$] or 1E19 [atoms/cm$^3$]

of boron ions are implanted, no currents flow when the gate voltage is low and a high effect can be obtained. This is because this effect is obtained when the product of the implanted doping quantity and the activation factor (the factor inherent to a-Si such as the quality of the film) has become almost equivalent to that of the impurity in the channel portion, that is, when the charge produced by doping has exceeded the charge of the channel impurity. In FIG. 3, the leakage reducing effect is a little lowered when 1E21 [atoms/cm$^3$] of boron ions are implanted. This is estimated to be the effect of damage by ion irradiation. It is understood, therefore, that the effect can be obtained when 1E18 [atoms/cm$^3$] or more boron ions are implanted, and that the best effect can be obtained when 1E18 [atoms/cm$^3$] of boron ions are implanted.

According to this embodiment, as described above, in order to shorten a manufacturing process, the a-Si film 16 is etched around the gate electrode 18 leaving the floating island portion 20 for preventing short-circuiting due to surface leakage, and furthermore, the a-Si film 16 that has the floating island portion 20 into which boron ions are implanted is constituted. By implanting the boron ions, the threshold voltage (Vth) of the floating island portion 20 is elevated, thereby reducing the generation of leakage current between the source electrode 14 and the drain electrode through the a-Si film 16 not beneath the gate electrode 18, and solving problems such as the discoloration of each pixel.

Although the structure of a top-gate type thin film transistor was described above, the present invention can be similarly applied to the structure of a bottom-gate type thin film transistor. That is, even in a bottom-gate type thin film transistor, the similar problems arise in a TFT that has the structure in which an a-Si film serving as a semiconductor film is present in the region between the source electrode and the drain electrode, not above the gate electrode. Therefore, the similar effect can be obtained by implanting boron ions in such a region.

Also, although boron is used in this embodiment as a P-type impurity, the similar effect can be obtained by using a P-type impurity other than boron (B) such as aluminum (Al). However, since acceleration is required for implanting P-type impurities, light elements are preferable. Furthermore, as described later, since the impurities must be passed through a gate insulating film 17, which is a silicon nitride film, for implanting, it is preferable to use boron, that is, a light element.

Next, the process for manufacturing the thin film transistor (TFT) according to this embodiment exemplified by a top-gate type TFT will be described referring to FIGS. 4A to 4D.

Figure 4A:
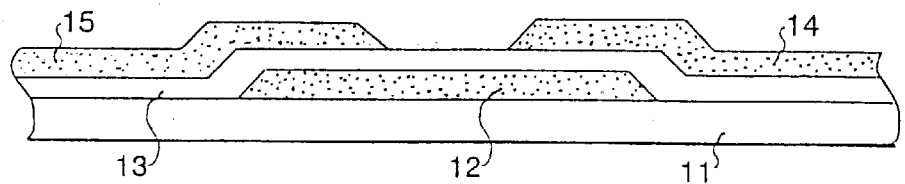
FIGS. 4A to 4D are diagrams illustrating the manufacturing process of a TFT according to an embodiment of the present invention.

As FIG. 4A shows, after cleaning an insulating substrate 11 such as a glass substrate using mechanical cleaning such as brushing (scrubbing) and chemical cleaning with an acid or organic solvent, an Mo alloy for light shielding is deposited to a predetermined film thickness using magnetron sputtering, and a light-shield film 12 is formed using the photolithography technique for photo-etching using a photoresist (not shown) as a mask. Next, an insulating film 13 comprising a, silicon oxide (SiO$_x$) film having a strong adhesiveness as an interlayer insulating film by the plasma CVD method. Then, ITO films for source and drain electrodes and an Mo-alloy film for the data bus line are sequentially formed by magnetron sputtering, and then the data bus line and drain and source electrodes are patterned using the photolithography technique to form a source electrode 14 and a drain electrode 15. Furthermore, an ITO film for a pixel electrode is deposited, and patterned to form a pixel electrode (not shown).

Figure 4B:
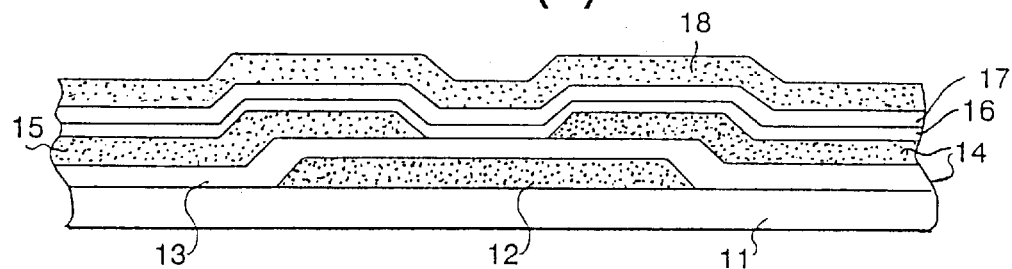

Next, as FIG. 4B shows, an a-Si film 16 as a semiconductor material is deposited using plasma CVD, and then a gate insulating film 17 comprising a first SiN$_x$ film and a second SiN$_x$ film is sequentially deposited by the plasma CVD method. Furthermore, without etching these films, Al for the gate electrode 18 and Al for the gate line (not shown) are deposited by magnetron sputtering. In this embodiment, the etching step after depositing the gate insulating film 17 comprising the a-Si film 16, the first SiN$_x$ film, and the second SiN$_x$ film has been deposited is omitted.

Figure 4C:
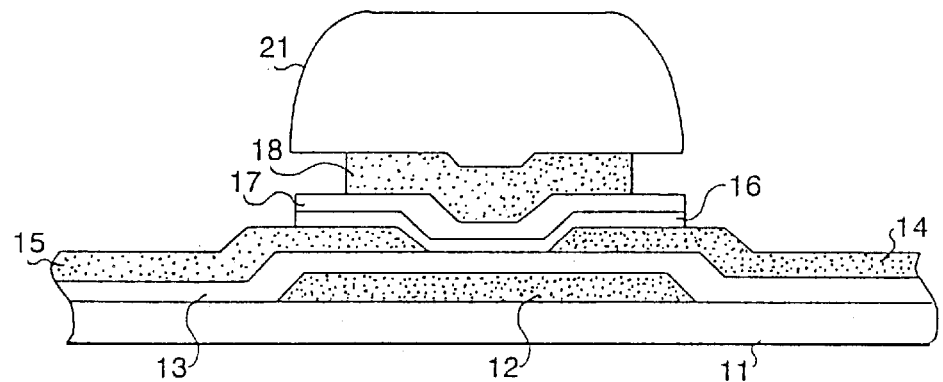

Then, after a resist mask 21 is formed as FIG. 4C shows, a gate electrode 18 and a gate line (not shown) are formed using the lithography technique. The gate electrode 18 is over-etched to about 1.5 μm inside the resist mask 21. Further in this embodiment, the a-Si film 16 and the gate insulating film 17 are simultaneously etched using this resist mask 21 as a mask. As a result, since these films are sequentially etched in a single lithography step, the manufacturing process can be greatly shortened. As a result of the shortened process, the region of the a-Si island formed by this etching is extended to the periphery of the gate electrode 18. Furthermore, since the gate electrode 18 has been over-etched, the a-Si film 16 and the gate insulating film 17 are formed in the area between the source electrode 14 and the drain electrode 15 but not beneath the gate electrode 18. Thereafter, the resist mask 21 is peeled off.

Figure 4D:
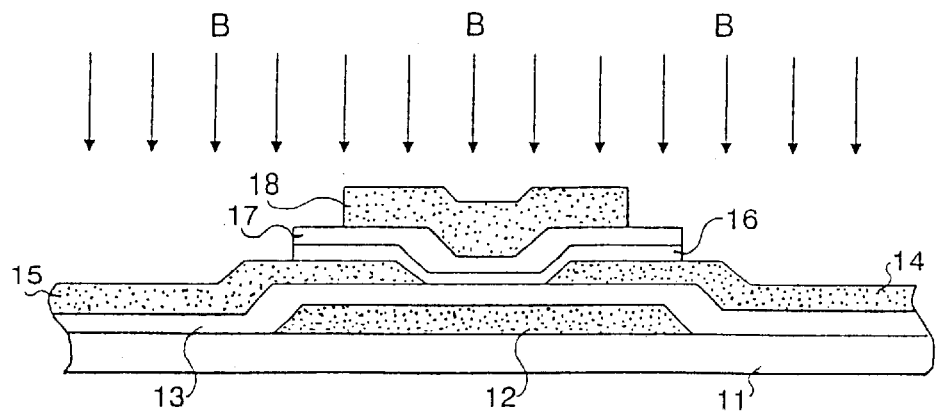

Next, as FIG. 4D shows, plasma ions are implanted from the top from the bucket shower source. Specifically, a DC voltage, for example, by a high frequency of 13.56 MHz is impressed to diborane (B$_2$H$_6$), which is a P-type doping gas to generate plasma ions, which are accelerated in an electric field to implant boron (B) into the TFT. In this implantation, since lighter plasma ions can be implanted with a higher power, the use of light boron can reach the a-Si film 16 passing through the gate insulating film 17. On the other hand, since the gate electrode 18 is made of a metal, it is difficult for boron to pass through it. As a result, the portion without the gate electrode 18 is doped with boron, and boron is implanted into the floating island portion 20 shown in FIG. 1A to form a boron-ion-implanted region 19 as shown in FIG. 1B. The implanted quantity is measured in the unite area (atoms/cm$^2$), and the quantity is determined by simulation so as to be the order of 1E18 [atoms/cm$^3$] and 1E19 [atoms/cm$^3$].

According to the above-described process for manufacturing a TFT, the number of required process steps can be decreased in the process for manufacturing a TFT, and boron ions can be implanted into the a-Si film 16 by a simple process step, whereby the threshold voltage (Vth) of the floating island portion 20 can be elevated, and a TFT substantially free of leakage paths can be manufactured.

Although the TFT of Embodiment 1 is configured so as to reduce leakage by implanting a P-type impurity into the floating island portion 20, Embodiment 2 is characterized in that leakage is reduced by the HMDS (hexamethyldisilazane (Si(Ch$_3$)$_3$)$_2$—NH) treatment.

The same configuration as in Embodiment 1 is denoted by the same symbols as in Embodiment 1, and is not described in detail.

Figure 5A:
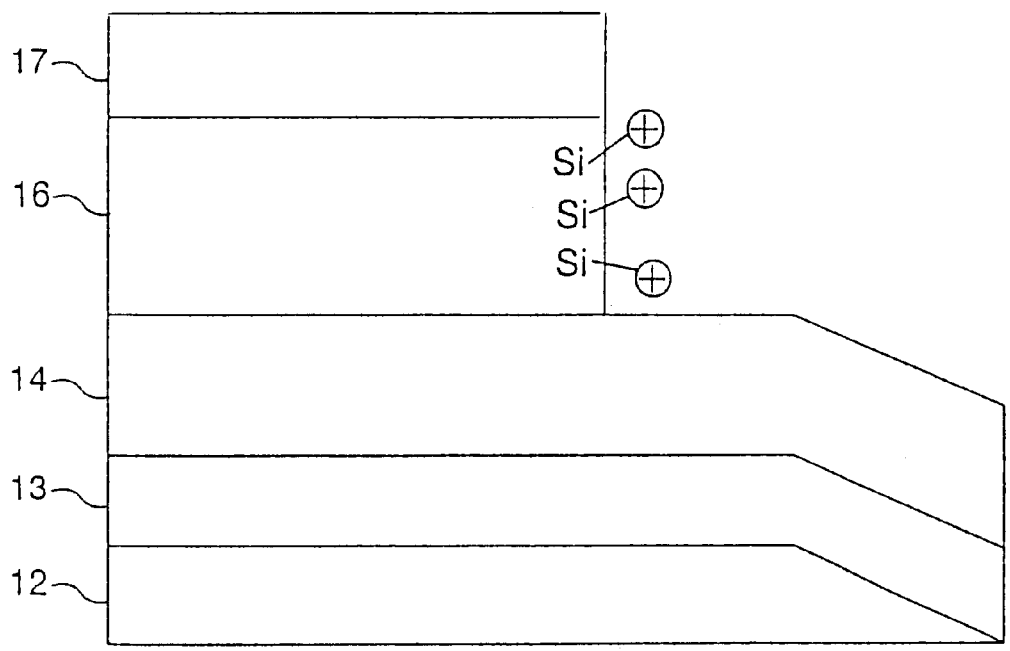
FIGS. 5A and 5B are diagrams illustrating the structure of a thin film transistor according to Embodiment 2 of the present invention.
Figure 5B:
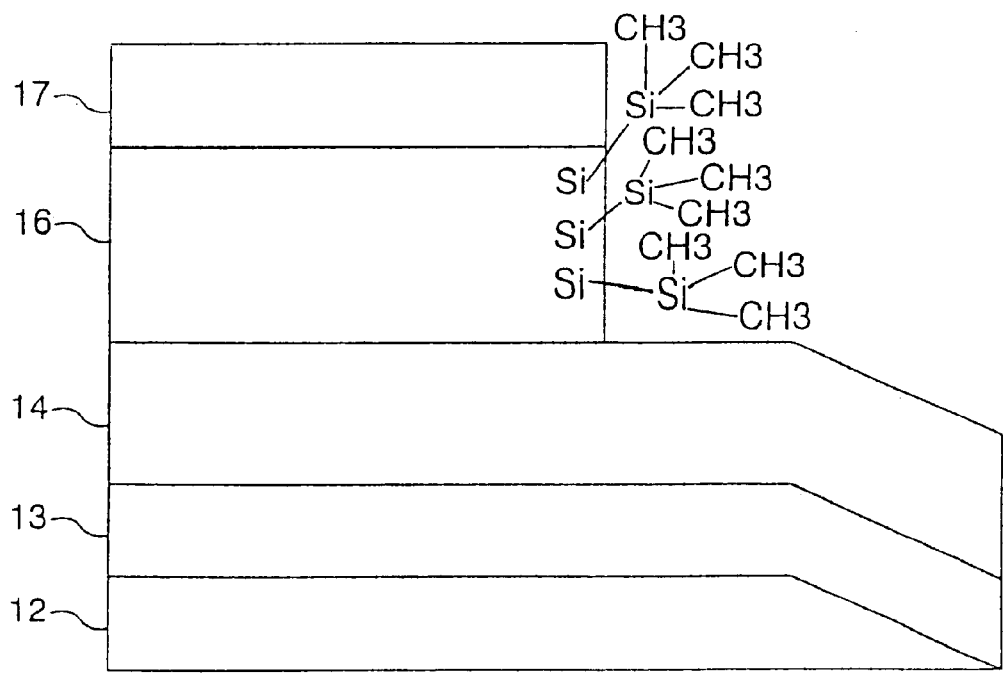

FIGS. 5A and 5B are partially enlarged diagrams of part of a TFT structure as shown in FIG. 1B, for illustrating the structure of Embodiment 2.

The major cause of the leakage current generated by the voltage between the source electrode 14 and the drain electrode 15 is that the width of the above-described floating island portion 20 is too large to control the voltage with the gate electrode 18. However, the inventors of the present invention came to find that the conductive element is induced by the cut section of silicon (Si) present on the cut surface of the a-Si film 16, causing leakage current to generate.

As FIG. 5A shows, there are a large number of bonds from which Si has been cut on the etched cut surface of the a-Si film 16. An Si cut section, i.e. a bond from which Si has been cut, is positively charged. In Embodiment 2, as FIG. 5B shows, the charge is terminated by the HMDS treatment of this cut surface of the a-Si film 16. That is, a leakage preventing film is formed on the a-Si film 16 to allow polymers to bond to the dangling bonds of Si. This enables the induction of conductive elements that cause leakage to be prevented, and leakage current is greatly reduced.

Figure 6:
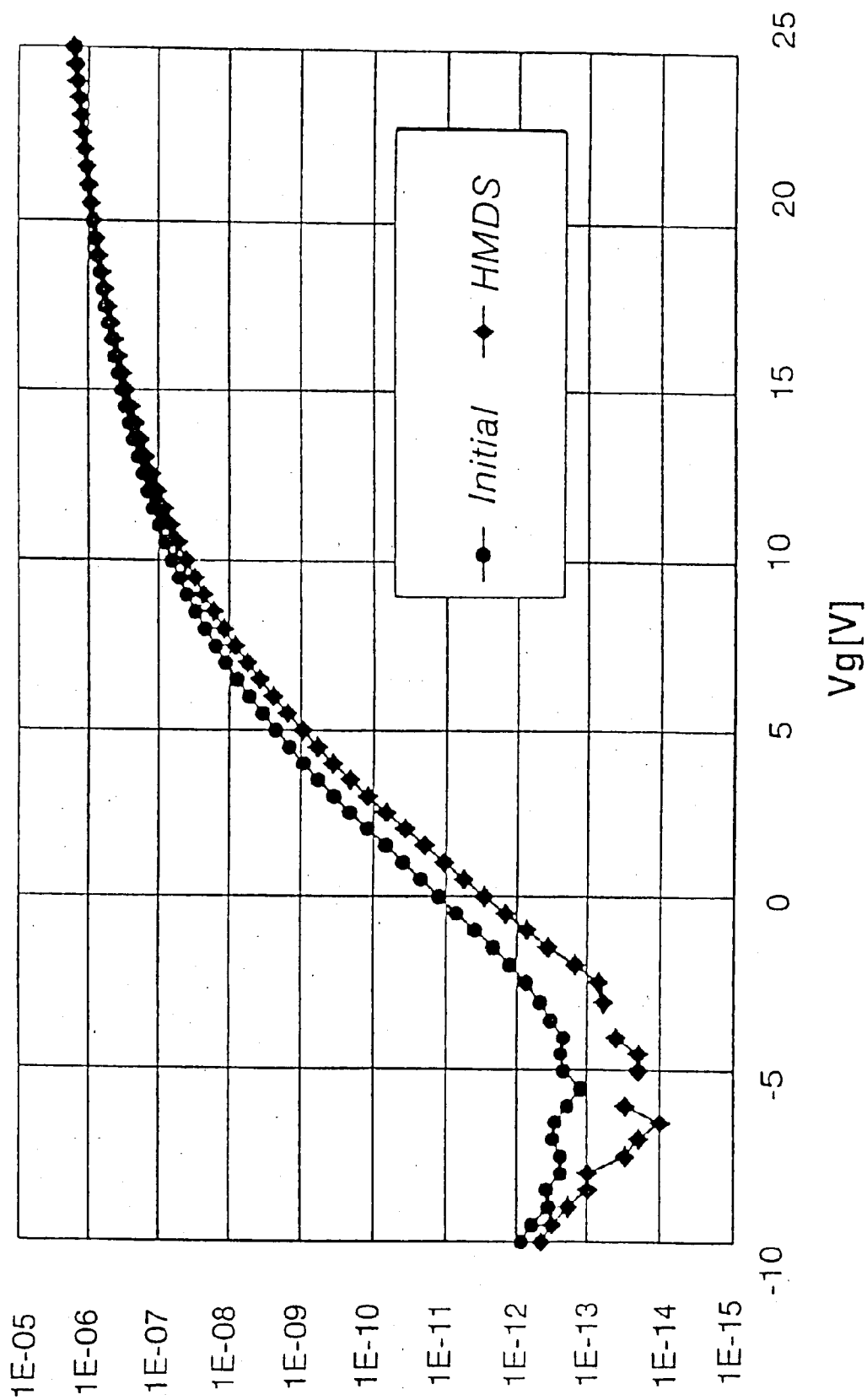
FIG. 6 is a graph showing the leakage reducing effect after a terminating treatment by HMDS.
Figure 7A:
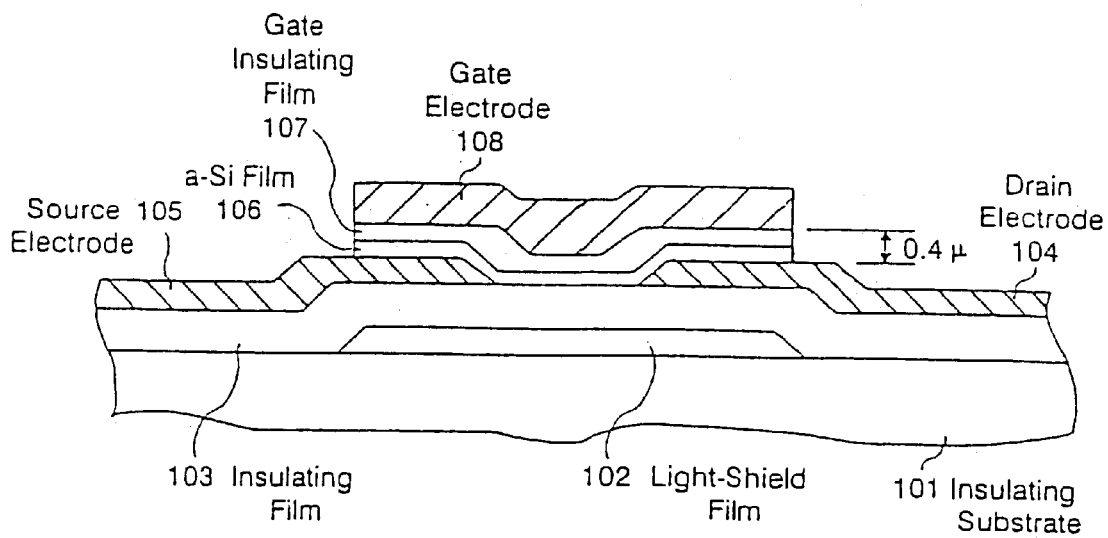
FIGS. 7A and 7B are diagrams illustrating the structure of a top-gate thin film transistor.
Figure 7B:
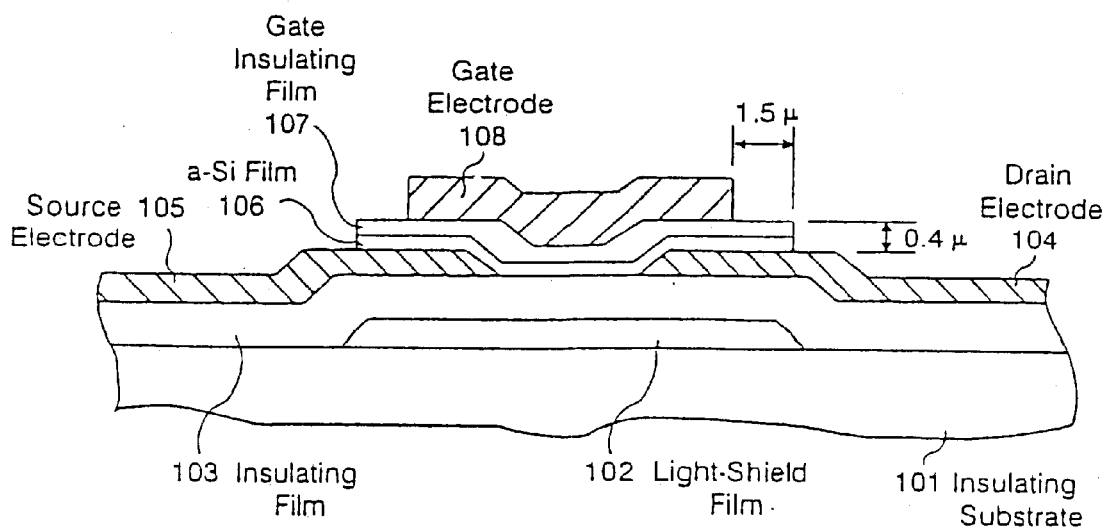
Figure 8A:
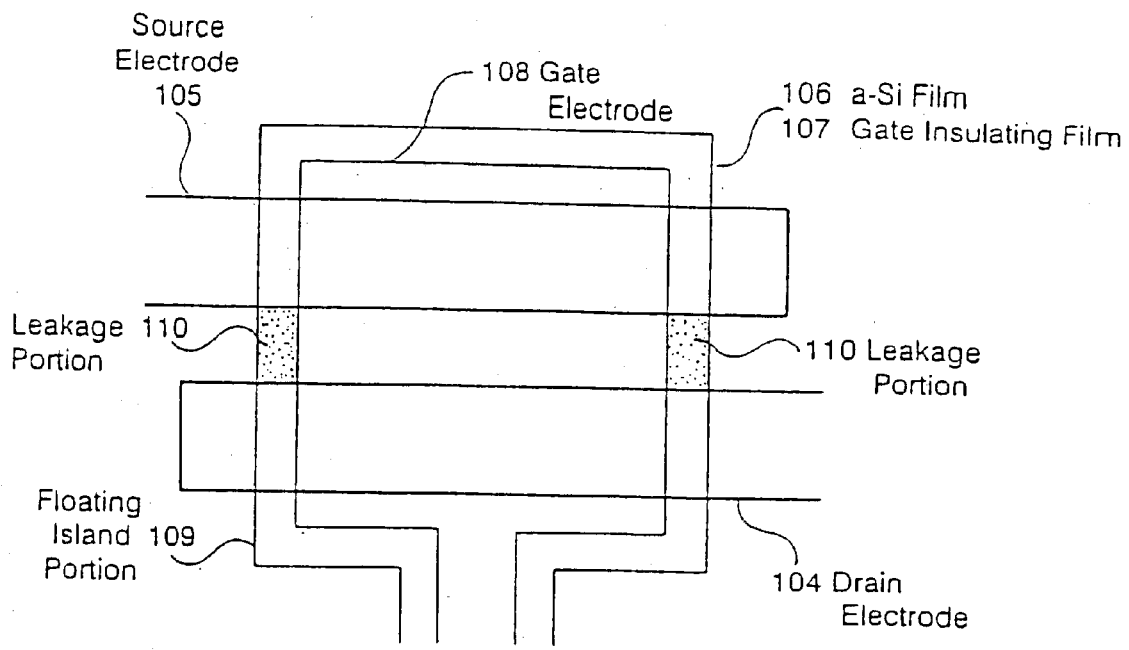
FIGS. 8A and 8B are diagrams illustrating the state after a floating island portion has been formed.
Figure 8B:
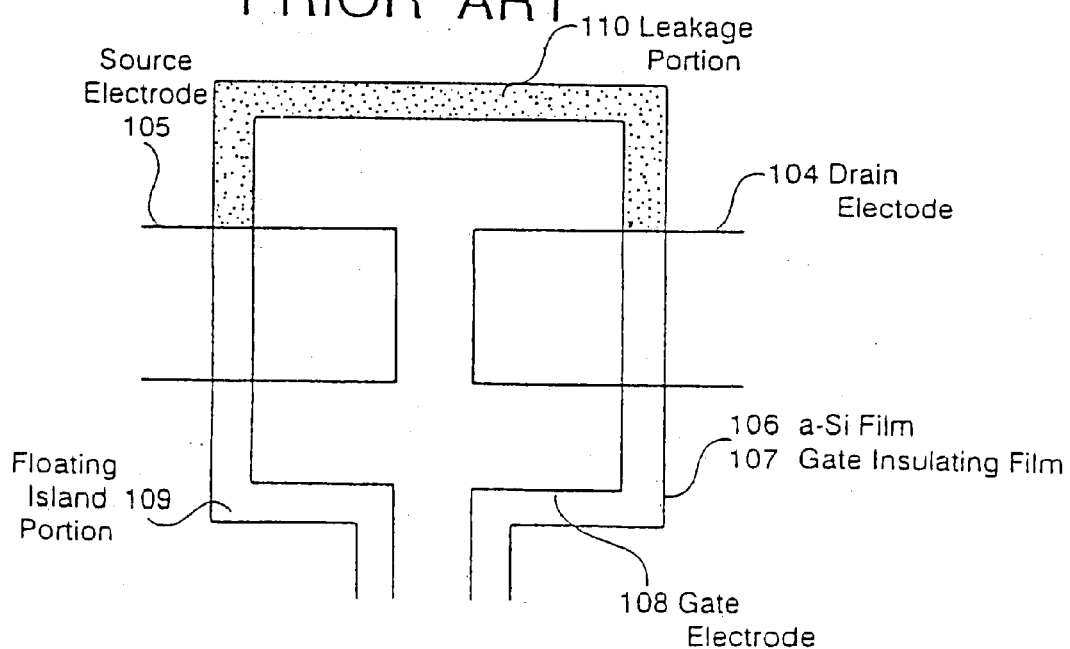

FIG. 6 is a graph showing the leakage reducing effect of the terminating treatment with HMDS. The abscissa of the graph shown in FIG. 6 indicates the gate voltage (Vg), and the ordinate indicates the current (Is) then flowing through the a-Si film 16. Units are the same as described for FIG. 3. The "Initial" curve shows the state where the terminating treatment has not been carried out. It is known from FIG. 6 that the HMDS treatment of Si cut sections greatly reduces the leakage current in the state of a low gate voltage (Vg).

As the process steps for the terminating treatment in Embodiment 2 can be, for example, the same as steps of FIGS. 4A to 4C, but in place of the step of FIG. 4D, the step of forming a leakage preventing film is carried out. That is, by exposing the TFT substrate to the atmosphere filled with the vapour of HMDS, the conversion to silanol (HMDS vapour treatment) can be carried out.

In this Embodiment 2, HMDS is used as an example of the leakage preventing film for the terminating treatment. However, the materials are not limited to HMDS, but any materials can be used as long as the material adheres to silicon bonds, and can terminate the silicon. For example, polymers such as polyimide can be used for forming the leakage preventing film.

Although the structure of a top-gate type TFT was described above together with the shortening of the manufacturing process for the ease of understanding, it is needless to say that the present invention can be applied to the structure of a bottom-gate TFT.

According to Embodiment 2, as described above, since there are no positively charged silicon cut sections, no conductive electrons that cause leakage are induced in the floating island portion 20. As a result, leakage current can be greatly reduced. Also according to Embodiment 2, since TFTs that excel in holding characteristics without increasing auxiliary capacity, a sufficient aperture ratio can be secured even in case of high precision.

According to the present invention as described above, the leakage current of a thin film transistor can be minimized.

While the invention has been particularly shown and described with respect to preferred embodiments thereof, it will be understood by those skilled in the art that the foregoing and other changes in form and details may be made therein without departing form the spirit and scope of the invention.

Having thus described our invention, what we claim as new, as desire to secure by Letters Patent is:

1. A thin film transistor, comprising:
   a source electrode and a drain electrode disposed above an insulating substrate at a predetermined interval;
   a semiconductor layer disposed in relation to said source and drain electrodes;
   a gate insulating film overlapping said semiconductor layer; and
   a gate electrode overlapping said gate insulator film,
   said semiconductor film having a portion which is disposed between said source electrode and said drain electrode and above which or beneath which said gate electrode is not formed, and a polymer structural film being formed on an end surface of the semiconductor film.

2. The thin film transistor according to claim 1, wherein the polymer structural film formed on an end surface of said semiconductor film is a leakage preventing film formed by bonding a polymer structure to a silicon cut section.

* * * * *